(12) United States Patent
Auch et al.

(10) Patent No.: US 8,344,360 B2
(45) Date of Patent: Jan. 1, 2013

(54) ORGANIC ELECTRONIC DEVICES WITH AN ENCAPSULATION

(75) Inventors: Mark Auch, Singapore (SG); Ewald Guenther, Singapore (SG); Lim Shuang Fang, Singapore (SG); Chua Soo Jin, Singapore (SG); Low Bee Ling, Singapore (SG)

(73) Assignees: Osram Opto Semiconductor GmbH, Regensburg (DE); Institute of Materials Research and Engineering, Singapore (SG)

( * ) Notice: Subject to any disclaimer, the term of this patent is extended or adjusted under 35 U.S.C. 154(b) by 0 days.

(21) Appl. No.: 09/968,167

(22) Filed: Sep. 28, 2001

(65) Prior Publication Data

US 2003/0062518 A1 Apr. 3, 2003

Related U.S. Application Data

(63) Continuation-in-part of application No. PCT/SG99/00143, filed on Dec. 17, 1999, and a continuation-in-part of application No. PCT/SG00/00133, filed on Sep. 6, 2000.

(51) Int. Cl.
*H01L 35/24* (2006.01)
(52) U.S. Cl. .................. 257/40; 257/704; 257/E51.001
(58) Field of Classification Search .............. 257/40, 257/88, 100, 684, 642, 676, 233, 175, 594, 257/731, 729, 700, 678, 780, 704, 710, E51.001; 438/121, 125, 781, 82
See application file for complete search history.

(56) References Cited

U.S. PATENT DOCUMENTS

| | | | |
|---|---|---|---|
| 3,904,783 A * | 9/1975 | Nara et al. | 430/315 |
| 4,253,741 A | 3/1981 | Nakauchi et al. | |
| 4,640,584 A * | 2/1987 | Tsubakimoto et al. | 349/153 |
| 4,714,323 A * | 12/1987 | Katagiri et al. | 349/184 |
| 4,811,081 A | 3/1989 | Lyden | |
| 4,842,946 A * | 6/1989 | Foust et al. | 428/458 |
| 4,961,962 A | 10/1990 | Morimoto | |
| 4,966,442 A * | 10/1990 | Ono et al. | 349/155 |
| 5,041,395 A | 8/1991 | Steffen | |
| 5,188,280 A | 2/1993 | Nakao et al. | |
| 5,220,446 A * | 6/1993 | Rho | 349/138 |
| 5,261,157 A * | 11/1993 | Chang | 29/844 |

(Continued)

FOREIGN PATENT DOCUMENTS
DE 3716856 12/1988
(Continued)

OTHER PUBLICATIONS

Cheang et al., An Optimized Process for Ultrathick Photosensitive Polyimide Applications, 1996, pp. 1-12.*

(Continued)

*Primary Examiner* — David Vu
*Assistant Examiner* — Duy T Nguyen
(74) *Attorney, Agent, or Firm* — Fish & Richardson P.C.

(57) ABSTRACT

An encapsulation for an organic light emitting diode (OLED) device is disclosed. The encapsulation includes a sealing dam surrounding the cell region of the OLED device to support a cap. Spacer particles are randomly located in the cell region to prevent the cap from contacting the active components, thereby protecting them from damage. The sealing dam provides a sealing region between the edge of the cap and dam in which an adhesive is applied to seal the OLED device. The use of the sealing dam advantageously enables devices to be formed with narrower sealing widths.

31 Claims, 8 Drawing Sheets

U.S. PATENT DOCUMENTS

| | | | |
|---|---|---|---|
| 5,313,055 A * | 5/1994 | Shiratsuki et al. | 250/208.1 |
| 5,385,499 A | 1/1995 | Ogawa et al. | |
| 5,399,805 A * | 3/1995 | Tyler et al. | 174/52.4 |
| 5,467,253 A * | 11/1995 | Heckman et al. | 361/761 |
| 5,473,449 A * | 12/1995 | Takemura et al. | 349/49 |
| 5,486,941 A * | 1/1996 | Saiuchi et al. | 349/155 |
| 5,550,408 A | 8/1996 | Kunitomo et al. | |
| 5,552,913 A * | 9/1996 | Shimizu et al. | 349/153 |
| 5,577,319 A | 11/1996 | Knecht | |
| 5,580,619 A | 12/1996 | Sakai et al. | |
| 5,610,742 A | 3/1997 | Hinata et al. | |
| 5,632,663 A | 5/1997 | Ishihara et al. | |
| 5,687,465 A * | 11/1997 | Hinata et al. | 29/402.01 |
| 5,693,956 A * | 12/1997 | Shi et al. | 257/40 |
| 5,714,838 A | 2/1998 | Haight et al. | |
| 5,724,230 A | 3/1998 | Poetzinger | |
| 5,750,258 A | 5/1998 | Sakai et al. | |
| 5,777,386 A | 7/1998 | Higashi et al. | |
| 5,804,917 A * | 9/1998 | Takahashi et al. | 313/504 |
| 5,811,177 A * | 9/1998 | Shi et al. | 428/209 |
| 5,821,692 A | 10/1998 | Rogers et al. | |
| 5,844,315 A | 12/1998 | Melton et al. | |
| 5,900,675 A | 5/1999 | Appelt et al. | |
| 5,909,081 A * | 6/1999 | Eida et al. | 313/504 |
| 5,920,080 A | 7/1999 | Jones | |
| 5,939,783 A | 8/1999 | Laine et al. | |
| 5,949,184 A | 9/1999 | Ohoshi et al. | |
| 5,964,030 A | 10/1999 | Lee et al. | |
| 5,965,907 A | 10/1999 | Huang et al. | |
| 6,022,583 A | 2/2000 | Falcone et al. | |
| 6,081,071 A * | 6/2000 | Rogers | 313/512 |
| 6,111,355 A * | 8/2000 | Inoue et al. | 313/506 |
| 6,111,356 A | 8/2000 | Roitman et al. | |
| 6,111,357 A * | 8/2000 | Fleming et al. | 313/509 |
| 6,124,918 A | 9/2000 | Park et al. | |
| 6,156,669 A * | 12/2000 | Knappenberger | 438/758 |
| 6,166,489 A | 12/2000 | Thompson et al. | |
| 6,172,879 B1 | 1/2001 | Cilia et al. | |
| 6,177,729 B1 | 1/2001 | Benenati et al. | |
| 6,184,959 B1 * | 2/2001 | Izumi | 349/124 |
| 6,198,220 B1 * | 3/2001 | Jones et al. | 313/512 |
| 6,210,815 B1 * | 4/2001 | Ooishi | 428/690 |
| 6,219,126 B1 | 4/2001 | Von Gutfeld | |
| 6,222,603 B1 | 4/2001 | Sakai et al. | |
| 6,232,667 B1 | 5/2001 | Hultmark et al. | |
| 6,235,356 B1 * | 5/2001 | Shibuya et al. | 428/34 |
| 6,259,204 B1 | 7/2001 | Ebisawa et al. | |
| 6,260,264 B1 | 7/2001 | Chen et al. | |
| 6,284,342 B1 * | 9/2001 | Ebisawa et al. | 428/69 |
| 6,309,502 B1 | 10/2001 | Hiroshige et al. | |
| 6,313,528 B1 | 11/2001 | Solberg | |
| 6,339,254 B1 | 1/2002 | Venkateshwaran et al. | |
| 6,355,125 B1 * | 3/2002 | Tahon et al. | 156/99 |
| 6,364,196 B1 | 4/2002 | Wood et al. | |
| 6,376,917 B1 | 4/2002 | Takeshita et al. | |
| 6,399,004 B1 | 6/2002 | Slager | |
| 6,569,706 B2 | 5/2003 | Pakbaz et al. | |
| 6,580,090 B2 | 6/2003 | Barth et al. | |
| 6,621,173 B2 | 9/2003 | Yamakawa et al. | |
| 6,633,124 B2 | 10/2003 | Himeshima et al. | |
| 6,649,221 B1 | 11/2003 | Tateno et al. | |
| 6,650,392 B2 | 11/2003 | Iwanaga et al. | |
| 6,734,942 B2 | 5/2004 | Takeuchi | |
| 6,791,660 B1 | 9/2004 | Hayashi et al. | |
| 6,833,668 B1 * | 12/2004 | Yamada et al. | 313/505 |
| 6,888,237 B1 | 5/2005 | Guenther | |
| 6,888,308 B1 | 5/2005 | Guenther | |
| 6,949,880 B1 | 9/2005 | Guenther et al. | |
| 6,952,078 B1 | 10/2005 | Guenther | |
| 7,166,007 B2 | 1/2007 | Auch et al. | |
| 2002/0000296 A1 | 1/2002 | Terada et al. | |
| 2002/0125484 A1 | 9/2002 | Silvernail et al. | |
| 2003/0062518 A1 | 4/2003 | Auch et al. | |
| 2003/0094691 A1 | 5/2003 | Auch et al. | |
| 2004/0217703 A1 | 11/2004 | Wittmann et al. | |

FOREIGN PATENT DOCUMENTS

| | | |
|---|---|---|
| EP | 0884792 A1 | 12/1998 |
| EP | 0910228 A1 | 4/1999 |
| EP | 0986112 A2 | 3/2000 |
| EP | 1021070 A1 | 7/2000 |
| JP | 58-160927 | 9/1983 |
| JP | 360122919 * | 7/1985 |
| JP | 61-234161 | 10/1986 |
| JP | 20-39026 | 2/1990 |
| JP | 03-171643 | 7/1991 |
| JP | 04-090512 | 3/1992 |
| JP | 04-136916 | 5/1992 |
| JP | 62-60057 | 9/1994 |
| JP | 90-54324 | 2/1997 |
| JP | 09-097679 | 4/1997 |
| JP | 62-188092 | 8/1997 |
| JP | 11-040347 | 2/1999 |
| JP | 11-176571 | 7/1999 |
| JP | 2000-30857 | 1/2000 |
| JP | 2000-030858 | 1/2000 |
| JP | 2000-040586 | 2/2000 |
| JP | 2000040586 * | 2/2000 |
| JP | 2000-133444 | 5/2000 |
| JP | 2000-208251 | 7/2000 |
| WO | WO 98/28767 A1 | 7/1998 |
| WO | WO 98/28947 A1 | 7/1998 |
| WO | WO 98/59528 A1 | 12/1998 |
| WO | WO 00/16361 A1 | 3/2000 |
| WO | WO 00/16362 A1 | 3/2000 |
| WO | WO 00/69002 | 11/2000 |
| WO | WO 01/04938 | 1/2001 |
| WO | WO 01/04963 A1 | 1/2001 |
| WO | WO 01/39174 A1 | 5/2001 |
| WO | WO 01/44865 A1 | 6/2001 |
| WO | WO 01/44866 A1 | 6/2001 |
| WO | WO 01/45140 A2 | 6/2001 |
| WO | WO 02/21557 A1 | 3/2002 |
| WO | WO 03/030272 A2 | 4/2003 |

OTHER PUBLICATIONS

Bahadur, Birenda (Ed), "Liquid Crystals, Applications and Uses", 1990, vol. 1, Chapter 7, pp. 171-194, ISBN 9810201109.

Burroughs et al., "Light-emitting diodes based on conjugated polymers", Nature, London, vol. 347, 1190, pp. 539-541.

Hayes et al., "Low-cost Display Assembly and Interconnect using Ink-jet Printing Technology", Journal Journal of the SID 9/1, 2001, pp. 9-13.

Bahadur, Birenda (ED), "Liquid Crystals, Applications and Uses", 1990, vol. 1, Chapter 7, pp. 397-436, ISBN 9810201109.

Translation of Official Letter for Japanese Application No. 2003-546415, dated Mar. 18, 2009, 4 pages.

Japan Patent Office, "Translation of the Appeal Decision", JP Appl. No. 2003-546415, issued on Aug. 30, 2011 (18 pages).

* cited by examiner

ORGANIC ELECTRONIC DEVICES WITH AN ENCAPSULATION

This application is a continuation-in-part of international patent applications titled "Encapsulation of Organic LED Devices", PCT/SG99/00143 filed Dec. 17, 1999 and "Sealing of Electronic Devices", PCT/SG00/00133 filed Sep. 6, 2000.

FIELD OF THE INVENTION

The present invention relates to organic light emitting diode (OLED) devices. More particularly, the invention relates to encapsulation of OLED devices.

BACKGROUND OF THE INVENTION

FIG. 1 shows a conventional OLED device 100. OLED devices can be used as displays in various consumer electronic products, including cellular phones, cellular smart phones, personal organizers, pagers, advertising panel, touch screen displays, teleconferencing equipment, multimedia equipment, virtual reality products, and display kiosks.

The conventional OLED device comprises a functional stack of one or more organic functional layers 110 between a transparent conductive layer 105 and a conductive layer 115. The functional stack is formed on a transparent substrate 101. The conductive layers can be patterned to form one or more cells or pixels on the substrate. Bond pads 150 are coupled to the cathodes and anodes to control the OLED pixels. In operation, charge carriers are injected through the cathodes and anodes for recombination in the functional layers. The recombination of the charge carriers causes the functional layer to emit visible radiation.

A cap 160, which forms a cavity 145 between it and the pixels, is mounted on the substrate. A sealant 187 is applied around the edges of the cap where it contacts the substrate. However, due to the gap G that exists between the cap and substrate, the sealing width W needs to be sufficiently wide to prevent oxygen and moisture from permeating through the sealant. Typically, the sealing width is about 0.2-2 mm with a gap of about 0.01-0.5 mm. Such a large sealing width results in inefficient use of chip area, limiting miniaturization of OLED devices.

As evidenced from the above discussion, it is desirable to provide OLED devices having improved sealing and reduced chip size, particularly those formed on thin or flexible substrates to prevent mechanical damage of the active device layers.

SUMMARY OF THE INVENTION

The invention relates generally to OLED devices. In particular, the invention relates to the encapsulation of OLED devices. In one embodiment, a sealing dam surrounding the cell region of the substrate is provided. The sealing dam supports the cap on the substrate and provides a sealing region located at an outer face of the sealing dam. In one embodiment, the sealing region is located between the edge of the cap and dam in which an adhesive is applied to seal the OLED device. The use of the sealing dam determines the gap between the cap and substrate (thereby providing a cavity space between the diode and the cap for mechanical protection) and the sealing widths.

In addition, spacer particles are provided in the device region to prevent the cap from contacting the OLED cells. In one embodiment, the spacer particles are randomly deposited on the substrate by spraying techniques. The spacer particles are deposited, for example, by a dry spray technique. Alternatively, a wet spray technique is employed to deposit the spacer particles on the substrate. Spacer particles in the non-device region are removed, leaving the spacer particles randomly distributed in the device region. A cap is mounted on the substrate to encapsulate the device. The spacer particles in the device region prevent the cap from contacting the OLED cells.

PREFERRED EMBODIMENTS OF THE INVENTION

Figure 2:
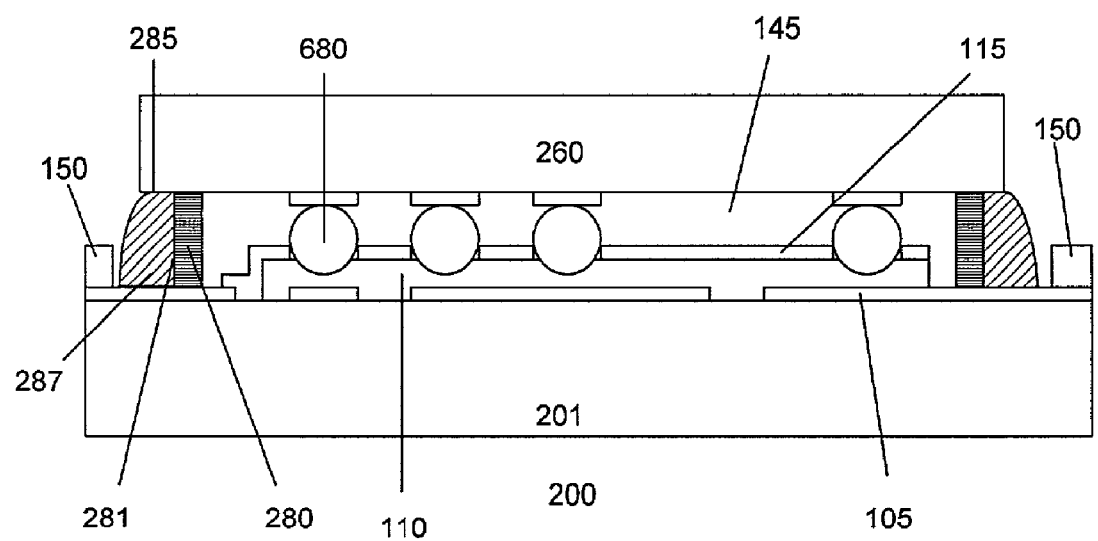
FIG. 2 shows an embodiment of the invention.

FIG. 2 shows an OLED device 200 in accordance with one embodiment of the invention. The OLED device comprises a substrate 201 on which pixels are formed. In one embodiment, the substrate comprises a transparent substrate, such as glass. Other types of transparent materials that serve as a substrate to support the OLED pixels are useful. The OLED pixels comprise one or more organic layers 110 sandwiched between cathodes 105 and anodes 115. In one embodiment, the cathodes and anodes are formed as strips in respective first and second directions. Typically, the first and second directions are orthogonal to each other. The OLED pixels are formed in the cell region of the substrate. Bond pads 150 are electrically coupled to the cathodes and anodes. A cap 260 is provided to encapsulate the OLED pixels. The cap provides a cavity 145, separating the cap from the OLED cells. In one embodiment of the invention, spacer particles 680 are provided between the OLED cells and the cap. The spacer particles prevent the cap from contacting the OLED cells.

Figure 1:
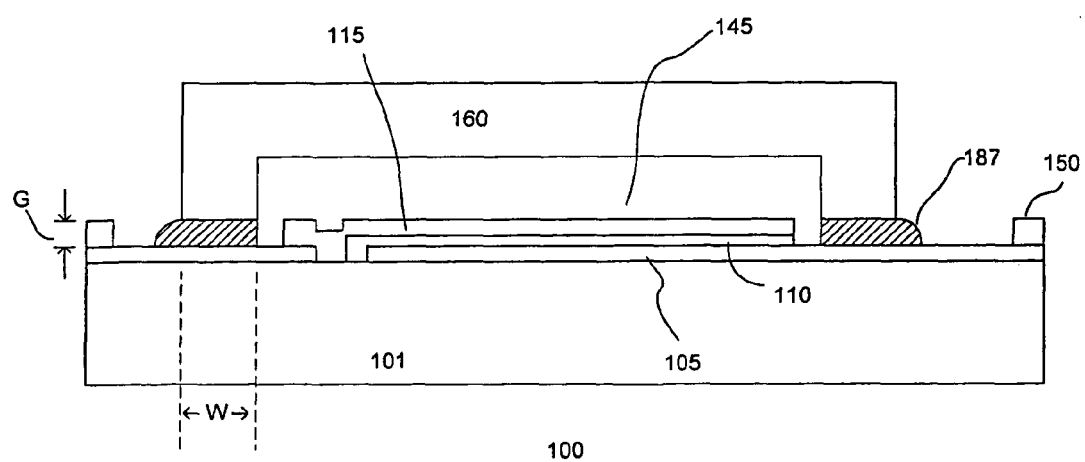
FIG. 1 shows a conventional OLED device.

In accordance with the invention, a sealing dam 280 is provided on the periphery of the cell region of the OLED device to support the cap. The height of the sealing dam defines the cavity 145. In one embodiment, the sealing dam comprises a non-conductive material to prevent shorting of the electrodes. A multi-layered sealing dam in which at least the layer in contact with the substrate comprises a non-conductive material can also be used. The sealing dam forms a sealing space or region 285, which abuts an outer face 281 of the sealing dam. In one embodiment, the sealing dam is located a distance from the edge of the cap, leaving a sealing space 285 between the edge of the cap and the dam. A sealant 287 fills the sealing space, hermetically sealing the device. The use of a sealing dam advantageously eliminates the gap (gap G in FIG. 1) that exists in conventional encapsulations. This enables devices formed with narrower sealing widths, for example, <1 mm. In one embodiment, the sealing width is from about 0.2 to less than 1 mm.

In addition, spacer particles 680 are deposited on the device region to prevent the cap from contacting the OLED cells. In one embodiment, the spacer particles comprise a spherical shape. Spacer particles having other geometric shapes, such as cubical, prism, pyramidal, or other regular or irregular shapes are also useful. The average mean diameter of the spacer particles should be sufficient to maintain the desired height of the cavity, which for example is about 2-50 μm. The size and shape distribution of the spacer particles should also be sufficiently narrow to ensure proper separation between the cap and OLED cells.

Figure 3:
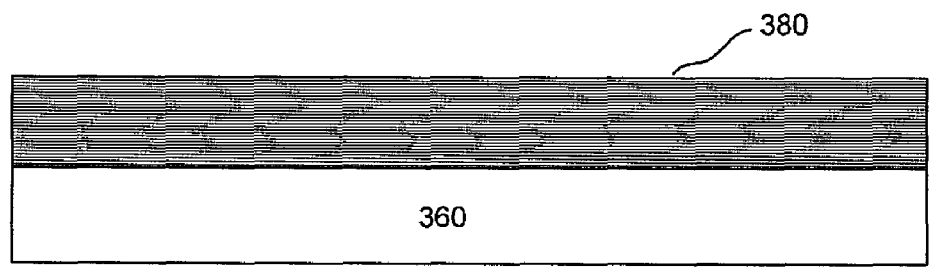
FIGS. 3-8 show a process for fabricating an OLED device in accordance with one embodiment of the invention.

FIGS. 3-8 show a process for fabricating an OLED device in accordance with one embodiment of the invention. Referring to FIG. 3, a substrate 360, which serves as an encapsulation cap, is provided. The substrate can comprise various types of materials, such as metal or polymer. The thickness of the substrate can be, for example, 0.4-2 mm. Providing a thin substrate (0.01-0.2 mm) is also useful, particularly for fabricating flexible devices.

A device layer 380 from which the sealing dam is formed is deposited on a major surface of the cap. In one embodiment, the device layer comprises a non-conductive photosensitive material, such as photoresist. Due to the fine geometry, the dam materials must either be directly or indirectly patternable. Other electrically insulating photosensitive materials, such as photopatternable polyimide, photopatternable polybenzoxazole, photopatternable polyglutarimide and other resins, are also useful. The height of the dam 280 (e.g. 1 um) is larger than the height of the organic layer 110 (ca. 0.5 um).

Figure 4:
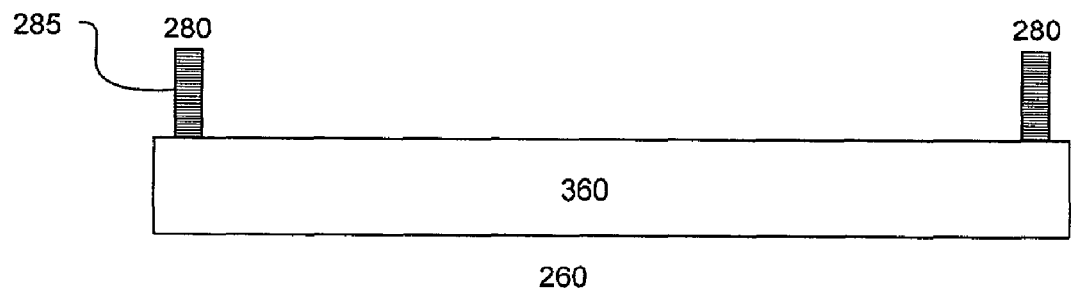

Referring to FIG. 4, the device layer is patterned to form a sealing dam 280. The patterning process includes, for example, selectively exposing the resist layer followed by a development process to remove the selected portions (i.e., exposed or unexposed portions are removed depending on the use of a positive or negative resist layer). In one embodiment, the sealing dam is formed a distance from the edge of the substrate 260, leaving a sealing region 285. Typically the sealing region is about 0.2-2 mm wide. The dam and substrate form a cap 260 to encapsulate the OLED device.

Alternatively, non-photosensitive materials that are non-conductive, such as spin-on glass, polyimide, polybenzoxazole, polyglutarimide, or benzocyclobutene, can be used to serve as the sealing dam layer. Other non-photosensitive materials such as polymers, including polyethylene, polystyrene, polypropylene or inorganic materials such as silicon oxide, silicon nitride, aluminum oxide are also useful. For non-photosensitive materials, an etch mask, such as resist, is provided for patterning the device layer.

In yet another embodiment, multiple layers are used to form a sealing dam stack. At least the upper most layer which contacts the OLED substrate comprises a non-conductive material. The layers are patterned using, for example, an etch mask to form the sealing dam.

Figure 5:
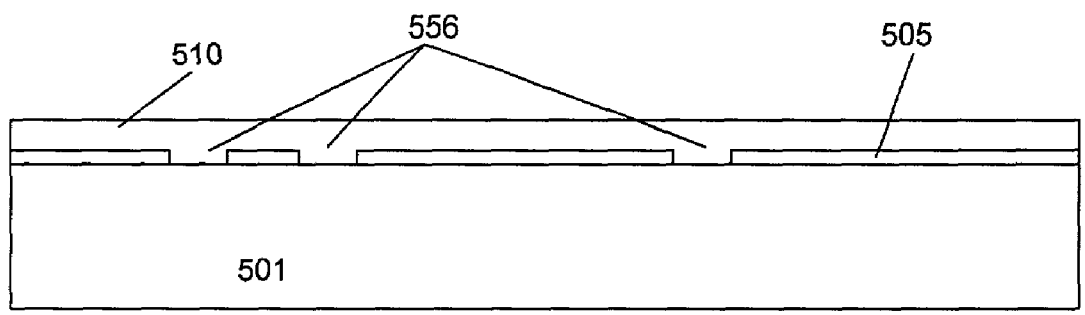

Referring to FIG. 5, a substrate 501 is provided on which OLED cell or cells are formed. The substrate can comprise various types of materials, such as glass or polymer. Other materials which can adequately support the OLED cells are also useful.

In one embodiment, the substrate comprises a flexible material, such as a plastic film for forming a flexible device. Such films, for example, include transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. A flexible substrate comprising thin glass or other flexible materials is also useful.

Figure 9:
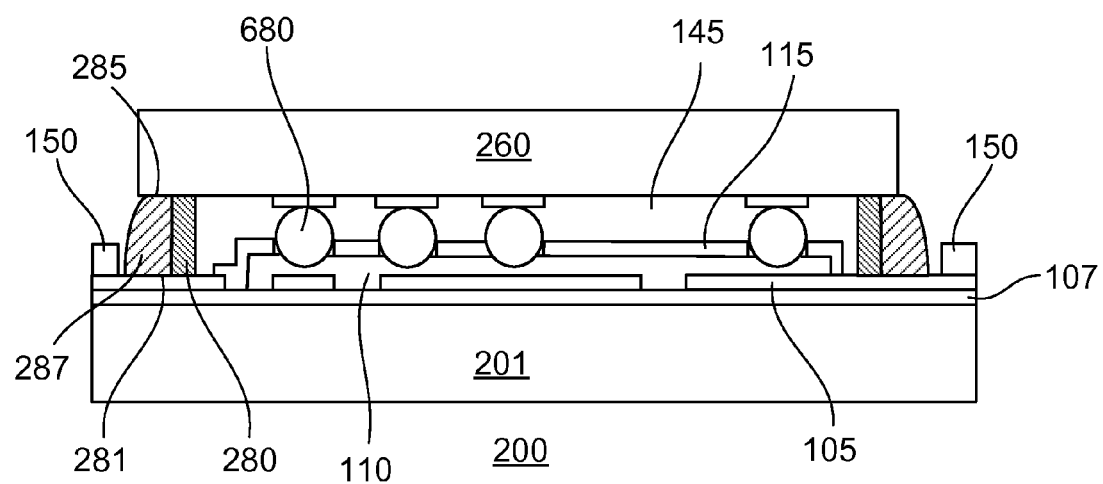
FIG. 9 shows another embodiment of the OLED device of FIG. 2.

A conductive layer 505 is deposited on the substrate. The substrate can be provided with a barrier layer (e.g., a barrier layer 107 shown in FIG. 9), such as silicon dioxide ($SiO_2$), beneath the conductive layer on the substrate surface prior to depositing the conductive. Barrier layers are particularly useful for substrates comprising soda lime glass. The barrier layer, for example, is about 20 nm thick. In one embodiment, the conductive layer comprises a transparent conductive material, such as indium-tin-oxide (ITO). Other types of transparent conductive layers, including zinc-oxide and indium-zinc-oxide, are also useful. Various techniques, such as chemical vapor deposition (CVD) physical vapor deposition (PVD), and plasma enhanced CVD (PECVD), can be employed to form the device layer. The conductive layer should be thin to reduce optical absorption and negative impact on subsequent film formation while satisfying electrical requirements. The conductive layer is typically about 0.02-1 μm thick.

The conductive layer 505 is patterned as desired to selectively remove portions of the layer, exposing portions 556 of the substrate. The patterned conductive layer serves as first electrodes for the OLED cells. In one embodiment, the conductive layer is patterned to form strips that serve as, for example, anodes of a pixelated OLED device. The patterning process can also form connections for bond pads. Conventional techniques, such as photolithography and etching, can be used to pattern the conductive layer. Patterning techniques using a stamp are also useful. Such techniques are described in co-pending international patent application titled "Mechanical Patterning of a Device Layer", which is herein incorporated by reference for all purposes.

One or more organic functional layers 510 are formed on the substrate, covering the exposed substrate portions and conductive layer. The functional organic layers comprise, for example, conjugated polymer or low molecular materials such as $Alq_3$. Other types of functional organic layers are also useful. The organic functional layers can be formed by conventional techniques, for example, wet processes such as spin coating or vacuum sublimation (for Alq3 organic layers). The thickness of the organic layers is typically about 2-200 nm.

Figure 6:
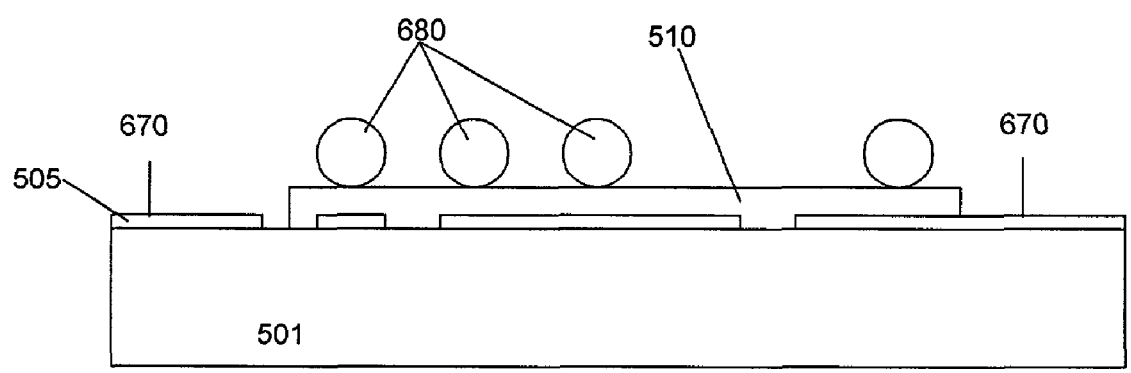

Referring to FIG. 6, portions of the organic layers can be selectively removed to expose underlying layers in regions 670 for bond pad connections. Selective removal of the organic layers can be achieved using, for example, a polishing process. Other techniques, such as etching, scratching, or laser ablation, are also useful.

In one embodiment, spacer particles are randomly distributed on the substrate. Preferably, the spacer particles are randomly distributed in the cell region in which OLED cells are formed. The spacer particles occupy active and non-active parts (e.g., emitting and non-emitting areas) of the device. The distribution or density of the spacer particles should be sufficient to prevent the cap from contacting the OLED cells in the presence of mechanical stress, whether by design (flexible devices) or accident (handling of the devices). The distribution can be varied to accommodate design requirements, such as the thickness of the cap, thickness of the substrate, and amount of device flexibility needed.

In a preferred embodiment, the spacer distribution is sufficient to maintain the height of the cavity without visibly affecting the emission uniformity of the OLED cells. Typically, a spacer distribution having an average distance between spacer particles of about 10-500 um is adequate in preventing the cap from contacting the OLED cells. In one embodiment, the density of the spacer particle distribution is about 10-1000 No/mm$^2$. Such a distribution along with the small size of the spacer particles ensures that their influence on emission uniformity is essentially invisible to the unaided human eye.

To avoid causing shorts between the anode and the cathode, the spacer particles preferably comprise a non-conductive material. In one embodiment, the spacer particles are made of glass. Spacer particles made of other types of non-conductive materials, such as silica, polymers, or ceramic, are also useful.

In one embodiment, the spacer particles are deposited by spraying techniques. In a preferred embodiment, a dry spray technique is employed to deposit the spacer particles. Dry spray techniques are described in, for example, Birenda Bahadur (Ed), Liquid Crystals: Applications and Uses, Vol. 1 (ISBN 9810201109), which is incorporated by reference for all purposes. The area on which the dam is located is cleaned of spacer particles, using a laser cleaning method, or any other suitable method to remove the particles, like scratching or patterning with photoresist.

Dry spray techniques typically comprise electrostatically charging the spacer particles with a first polarity (positive or negative) and the substrate with a second polarity (negative or positive). The spacer particles are blown against the substrate with dry air supplied by a dry air sprayer. Dry air sprayers, such as a DISPA-μR from Nisshin Engineering Co., can be used. Electrostatic attraction causes the spacer particles to adhere to the substrate while electrostatic repulsion between the particles prevents particle agglomeration on the substrate.

The use of a wet spray technique to deposit the spacer particles on the substrate is also useful. Wet spray techniques are described in, for example, Birenda Bahadur (Ed), Liquid Crystals: Applications and Uses, Vol. 1 (ISBN 9810201109), which is already incorporated by reference for all purposes. Typically, the spacer particles are suspended in an alcoholic or aqueous liquids, such as ethanol, isopropanol, or a mixture comprising alcohol and water. The spacer concentration, for example, is about 0.1-0.5% by weight. Ultrasonic waves can be used to disperse the particles to prevent agglomeration. For example, the spacer particles can be irradiated with ultrasonic waves for several minutes prior to particle deposition. The prepared suspension is sprayed with air through a nozzle onto the substrate, depositing the spacer particles thereon.

Figure 7:
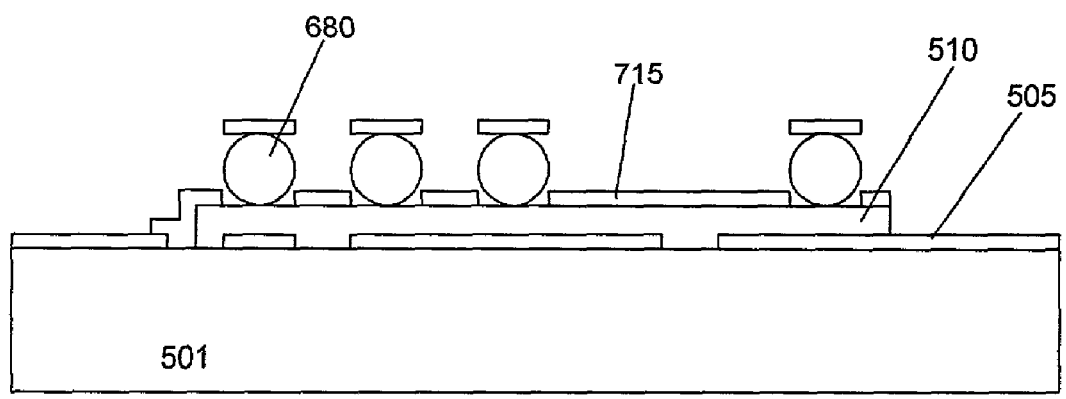

Referring to FIG. 7, a second conductive layer 715 is deposited on the substrate, covering the spacer particles and other layers formed thereon. The conductive layer comprises, for example, a metallic material such as Ca, Mg, Ba, Ag or a mixture or alloy thereof. Other conductive materials, particularly those which comprises a low work function, can also be used to form the second conductive layer. In one embodiment, the second conductive layer is patterned to form electrode strips that serve as cathode for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels.

Figure 8:
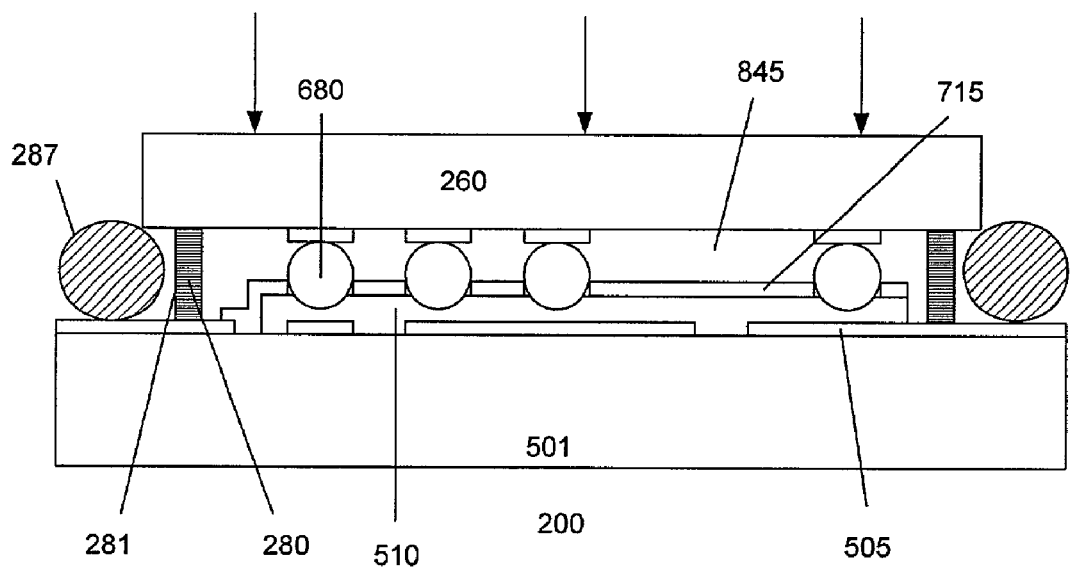

Referring to FIG. 8, the cap 260 is mounted on the substrate with the OLED pixels, aligning the sealing dam to surround the cell region of the OLED device. Pressure is applied to the cap and/or substrate to press them together to avoid the sealant creeping into the gap between the sealing dam and the substrate. A sealant 287 is applied on the substrate around the cap. The sealant, for example, comprises uv-curable epoxy. Other types of sealants such as heat curable epoxy or acrylates are also useful. The sealant creeps in to fill the sealing region 285 between the cap and substrate. The sealant, for example, is cured (e.g., UV or thermal), thus hermetically sealing the OLED device 200.

The cap creates a cavity 845, providing separation between it and the OLED cells. During the mounting process, the spacer particles may be pressed into the layers of the OLED cells. The spacer particles provide support for the cap over the area of the OLED cells, preventing the cap from contacting the active components of the device when pressure is applied to the cap.

As described, the process deposits the spacer particles after formation of the organic layers. The spacer particles can alternatively be deposited at other points in the process flow. For example, the spacer particles can be deposited before the formation of the first conductive layer or before the formation of the organic layers. In effect, the spacer particles can be deposited at any point of the process prior to the formation of the second conductive layer.

The process forms a sealing dam on the cap, as described in FIGS. 3-4. Alternatively, the sealing dam can be formed on the substrate. The dam is formed after the formation of the first conductive layer, but before the formation of the organic functional layer and the deposition of spacer particles.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
    a substrate having a cell region defined on a main surface of the substrate, the cell region comprising at least one active component formed thereon, wherein the active component in the cell region comprises one or more OLED cells, and each OLED cell comprises an organic functional layer and a conductive layer, wherein the organic functional layer is configured to emit visible radiation by recombination of charge carriers;
    a sealing dam on the substrate surrounding the cell region, wherein the sealing dam includes a photosensitive or photopatternable material;
    a cap supported by the sealing dam wherein the conductive layer is located between the cap and the organic functional layer and wherein a cavity is located between the one or more OLED cells and the cap;
    spacer particles distributed in the cell region, the spacer particles configured and at least partially arranged in the cavity so that the cap does not contact the one or more OLED cells in the cell region and wherein the spacer particles are in direct contact with the organic functional layer of the one or more OLED cells and the spacer particles do not electrically isolate sections of the organic functional layer from each other;
    a sealing region abutting an outer vertical surface of the sealing dam; and
    an adhesive located in the sealing region, the adhesive hermetically sealing the cell region.

2. The device of claim 1 wherein the substrate comprises a flexible substrate.

3. The device of claim 1 or 2 wherein the spacer particles comprise a non-conductive material.

4. The device of claim 3 wherein the adhesive comprises a thermally cured adhesive.

5. The device of claim 4 wherein the sealing dam comprises a non-conductive material.

6. The device of claim 5 wherein a distribution of the spacer particles are configured to a sufficient density so that the cap does not contact the organic functional layer.

7. The device of claim 5 wherein a mean diameter of the spacer particles is sufficient so that the cap does not contact the organic functional layer.

8. The device of claim 7 wherein a distribution of the spacer particles has a sufficient density so that the cap does not contact the organic functional layer.

9. The device of claim 3 wherein the sealing dam comprises a non-conductive material.

10. The device of claim 9 wherein a distribution of the spacer particles has a sufficient density so that the cap does not contact the organic functional layer.

11. The device of claim 9 wherein a mean diameter of the spacer particles is sufficient so that the cap does not contact the organic functional layer.

12. The device of claim 11 wherein a distribution of the spacer particles has a sufficient density so that the cap does not contact the organic functional layer.

13. The device of claim 3 wherein a distribution of the spacer particles has a sufficient density so that the cap does not contact the organic functional layer.

14. The device of claim 3 wherein a mean diameter of the spacer particles is sufficient so that the cap does not contact the organic functional layer.

15. The device of claim 14 wherein a distribution of the spacer particles has a sufficient density so that the cap does not contact the organic functional layer.

16. An OLED device comprising:
a substrate having a cell region defined on a main surface of the substrate, the cell region comprising at least one OLED cell;
a dielectric sealing dam on the substrate surrounding the cell region;
a cap supported by the sealing dam, wherein the OLED cell comprises an organic functional layer and a conductive layer located between the organic functional layer and the cap, wherein the organic functional layer is configured to emit visible radiation by recombination of charge carriers;
a cavity defined between the OLED cell and the cap;
spacer particles distributed in the cell region, wherein parts of the spacer particles are arranged in the cavity and in the organic functional layer of the at least one OLED cell, wherein the organic functional layer is uninterrupted by the spacer particles;
a sealing region abutting an outer vertical surface of the dielectric sealing dam; and
an adhesive located in the sealing region and on the main surface of the substrate such that the sealing dam separates the adhesive from the cell region, the adhesive hermetically sealing the OLED cell region and not contacting a side surface of the substrate.

17. The OLED device of claim 16 wherein the substrate comprises a flexible substrate.

18. The OLED device of claim 17 wherein the adhesive comprises a thermally cured adhesive.

19. The OLED device of claim 16 wherein the adhesive comprises a thermally cured adhesive.

20. The OLED device of one of claims 18-19 wherein the spacer particles comprise a non-conductive material.

21. The device of claim 20 wherein a distribution of the spacer particles has a sufficient density so that the cap does not contact the organic functional layer.

22. The device of claim 20 wherein a mean diameter of the spacer particles is sufficient so that the cap does not contact the organic functional layer.

23. The device of claim 22 wherein a distribution of the spacer particles has a sufficient density so that the cap does not contact the organic functional layer.

24. An OLED device comprising:
a substrate having a cell region defined on a main surface of the substrate, the cell region comprising at least one OLED cell;
a sealing dam surrounding the cell region, wherein the sealing dam includes a photosensitive or photopatternable material;
a cap supported by the sealing dam, wherein the OLED cell comprises an organic functional layer and a conductive layer located between the organic functional layer and the cap, and the organic functional layer configured to emit visible radiation by recombination of charge carriers;
a cavity defined between the cap and the OLED cell, the cavity separating the cap and the OLED cell in the cell region;
dielectric spacer particles distributed in the cell region having an average distance between the spacer particles of about 10 to 500 µm, the dielectric spacer particles at least partially arranged in the cavity, in direct contact with the organic functional layer and in a vertical orientation between the organic functional layer and the cap so that the cap does not contact the OLED cell and the organic functional layer is not interrupted by the spacer particles;
a sealing region abutting an outer vertical surface of the sealing dam; and
an adhesive located in the sealing region and on the main surface of the substrate such that the sealing dam separates the adhesive from the cell region, wherein the adhesive hermetically seals the OLED cell.

25. The device of claim 1, wherein the spacer particles are between the conductive layer and the organic functional layer along a direction extending perpendicular to a main surface of the cap.

26. The device of claim 24, wherein:
the conductive layer is a first conductive layer;
the device includes a second conductive layer;
along a direction parallel to a main surface of the cap, the first conductive layer has a portion on a first side of one spacer particle and a portion on a second opposite side of the one spacer particle; and
along a direction perpendicular to the main surface of the cap, the first conductive layer has a portion that is between the spacer particle and the cap and the second conductive layer is between the spacer particle and the substrate.

27. The device of claim 16, wherein:
the conductive layer is a first conductive layer;
the device includes a second conductive layer;
along a direction parallel to a main surface of the cap, the first conductive layer has a portion on a first side of one spacer particle and a portion on a second opposite side of the one spacer particle; and
along a direction perpendicular to the main surface of the cap, the first conductive layer has a portion that is between the spacer particle and the cap and the second conductive layer is between the spacer particle and the substrate.

28. An OLED device comprising:

a substrate having a cell region defined on a main surface of the substrate, the cell region comprising at least one OLED cell;

a sealing dam surrounding the cell region, wherein the sealing dam includes a material selected from polybenzoxazole, polyglutarimide, and benzocyclobutene;

a cap supported by the sealing dam, wherein the OLED cell comprises a barrier layer, a first conductive layer, an organic functional layer and a second conductive layer arranged on the substrate upon each other in this sequence, and the organic functional layer is configured to emit visible radiation by recombination of charge carriers;

dielectric spacer particles distributed in the cell region, the dielectric spacer particles configured and arranged in the organic functional layer so that the cap does not contact the OLED cell in the cell region and so that the organic functional layer is not interrupted by the spacer particles;

a sealing region abutting an outer vertical surface of the sealing dam; and an adhesive located in the sealing region and on the main surface of the substrate, wherein the adhesive hermetically seals the OLED cell region and the adhesive in the sealing region is not on a side surface of the substrate.

29. The device of claim 1, wherein the sealing dam and the cap are not integrally formed.

30. The device of claim 1, wherein the sealing dam separates the adhesive from the cell region.

31. A device comprising:

a substrate having a cell region defined on a main surface of the substrate, the cell region comprising at least one active component formed thereon, wherein the active component in the cell region comprises one or more OLED cells, and each OLED cell comprises an organic functional layer and a conductive layer, wherein the organic functional layer is configured to emit visible radiation by recombination of charge carriers;

a sealing dam on the substrate surrounding the cell region, wherein the sealing dam includes a photosensitive or photopatternable material;

a cap supported by the sealing dam wherein the conductive layer is located between the cap and the organic functional layer and wherein a cavity is located between the one or more OLED cells and the cap;

spacer particles distributed in the cell region, the spacer particles configured and at least partially arranged in the cavity so that the cap does not contact the one or more OLED cells in the cell region and wherein the spacer particles are in direct contact with the organic functional layer of the one or more OLED cells and the spacer particles do not electrically isolate sections of the organic functional layer from each other;

a sealing region abutting an outer vertical surface of the sealing dam; and an adhesive located in the sealing region such that the sealing dam separates the adhesive from the cell region, the adhesive hermetically sealing the cell region, wherein the adhesive in the sealing region is on the main surface of the substrate and does not cover a side surface of the substrate.

* * * * *

UNITED STATES PATENT AND TRADEMARK OFFICE
CERTIFICATE OF CORRECTION

PATENT NO. : 8,344,360 B2
APPLICATION NO. : 09/968167
DATED : January 1, 2013
INVENTOR(S) : Mark Dai Joong Auch et al.

It is certified that error appears in the above-identified patent and that said Letters Patent is hereby corrected as shown below:

Column 8, line 39:
In Claim 24, delete "cell." and insert -- cell region --.

Signed and Sealed this
Nineteenth Day of March, 2013

Teresa Stanek Rea
*Acting Director of the United States Patent and Trademark Office*